(12) United States Patent
Foletto et al.

(10) Patent No.: US 11,621,657 B1
(45) Date of Patent: Apr. 4, 2023

(54) CURRENT SENSE CALIBRATION IN A MOTOR CONTROL SYSTEM

(71) Applicant: Allegro MicroSystems, LLC, Manchester, NH (US)

(72) Inventors: Andrea Foletto, Andorno Micca (IT); Daniel Jacques, Jefferson, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/648,165

(22) Filed: Jan. 17, 2022

(51) Int. Cl.
*H02P 6/28* (2016.01)
*H02P 27/08* (2006.01)

(52) U.S. Cl.
CPC ...................... *H02P 6/28* (2016.02)

(58) Field of Classification Search
CPC .................. H02P 6/28; H02P 27/08
See application file for complete search history.

(56) References Cited

U.S. PATENT DOCUMENTS

| | | | |
|---|---|---|---|
| 9,172,565 B2 | 10/2015 | Cadugan et al. | |
| 9,634,715 B2 | 4/2017 | Scheinkerman et al. | |
| 9,787,495 B2 | 10/2017 | Vreeland et al. | |
| 10,348,223 B1* | 7/2019 | Khosravi | G01R 31/343 |
| 10,747,708 B2 | 8/2020 | Kozomora et al. | |
| 10,784,810 B1* | 9/2020 | Lu | G01R 19/0092 |
| 11,002,768 B2* | 5/2021 | Lee | H03F 3/45 |
| 2020/0028456 A1* | 1/2020 | Morioka | F04D 17/16 |
| 2022/0069748 A1* | 3/2022 | Watanabe | H02M 7/5395 |

* cited by examiner

*Primary Examiner* — Thai T Dinh
(74) *Attorney, Agent, or Firm* — Daly, Crowley, Mofford & Durkee, LLP

(57) ABSTRACT

A motor control system includes a gate driver motor controller and a microcontroller configured to generate a commutation command signal for coupling to the gate driver motor controller. The gate driver motor controller includes a current measurement circuit to measure current in each of three current paths corresponding to three motor windings, an interface to transmit a first subset of the measured currents corresponding to a first subset of the current paths, and a calibrator to calibrate a current path that is not part of the first subset of current paths when the first subset of the measured currents is transmitted. The microcontroller includes an interface to receive the first subset of measured currents and a processor to compute the current in the current path that is not part of the first subset of current paths based on the first subset of measured currents.

23 Claims, 5 Drawing Sheets

CURRENT SENSE CALIBRATION IN A MOTOR CONTROL SYSTEM

CROSS-REFERENCE TO RELATED APPLICATIONS

Not Applicable.

STATEMENT REGARDING FEDERALLY SPONSORED RESEARCH

Not Applicable.

FIELD

This disclosure relates generally to current sense calibration in a motor control system.

BACKGROUND

Circuits to control and regulate electric motors, such as brushless DC ("BLDC") motors, are required in many applications. The current flow through each of the motor phases can be used by a controller to determine motor position and commutate the motor according to user commands. It is also often useful to know the average supply current provided to the motor, for example for circuit protection and current limiting purposes to protect hardware circuits and the motor from current overshoots or surges that may cause damage. Additionally, the average supply current can be useful to determine power consumption of the motor.

Phase currents can be measured with shunt resistors in series with one or more motor windings. The use of shunt resistors is a relatively inexpensive approach and three phase motor systems can use one, two, or three shunt resistors. In three-phase systems, according to Kirchhoff's Current Law, the sum of the currents in the three phases is equal to zero. Thus, it is possible to determine the currents in all three phases by measuring the current in only two of the three phases and computing the third current.

It is important to measure the phase currents with high resolution and high accuracy. Operational amplifiers with low offset and high accuracy are sometimes used to process the current through the shunt resistors. Complex techniques can be required for calibration purposes, in order to determine and remove (or at least reduce) the effects of signal path offset and sensitivity variations that could otherwise affect the accuracy of current measurement and motor control.

Motors and their control systems are widely used in automobiles and other safety critical applications. There are a variety of specifications that set forth requirements related to permissible motor control quality levels, failure rates, and overall functional safety.

SUMMARY

Described herein are motor control apparatus and techniques for calibrating current sensing in a gate driver motor controller by transmitting measured currents of two motor phases at each communication (e.g., SPI frame) and calibrating the third phase current during the communication time. During a subsequent communication time, a different pair of two measured phase currents is transmitted and calibration is performed on a different phase current path for which the current is not being communicated. With this arrangement, calibration can take longer than the communication time period as long as it is completed before the next communication time period commences when the measured current of the respective phase is transmitted. Further, the described calibration is performed without affecting motor control timing since it is not necessary to delay current measurement transmission for calibration to be performed and without losing information because of the ability of the described calibration to externally reconstruct the current on all of the three phases for proper motor control without compromises in the current measurement. The microcontroller receiving two measured currents at a time can compute the third measured current based on the received measured currents. In this way, all of the current information is provided at the microcontroller with the same time stamp (i.e., acquired at the same time). Diagnostics can be performed in order to verify the measurement of the phase current that is not transmitted. With this internal check, transmitting only two phase currents and computation of the third current by the microcontroller can be trusted.

According to the disclosure, a motor control system for controlling operation of a motor having three windings establishing three respective current paths includes a gate driver motor controller and a microcontroller configured to generate a commutation command signal for coupling to the gate driver motor controller. The gate driver motor controller includes a current measurement circuit configured to measure a current in each of the three current paths, an interface configured to transmit a first subset of the measured currents corresponding to a first subset of the current paths, and a calibrator configured to calibrate a current path that is not part of the first subset of current paths when the first subset of the measured currents is transmitted. The microcontroller includes an interface configured to receive the first subset of measured currents, and a processor configured to compute the current in the current path that is not part of the first subset of current paths based on the first subset of measured currents.

Features may include one or more of the following individually or in combination with other features. The motor control system can include, for each of the three windings, a sensing element coupled in series with the respective winding. The gate driver motor controller can further include a latch configured to latch the measured current in each of the three current paths. The gate driver motor controller interface can be configured to transmit the first subset of measured currents during a first frame, transmit a second subset of the measured currents during a second frame following the first frame, and transmit a third subset of the measured currents during a third frame following the second frame, wherein the first, second, and third subsets of measured currents are different than each other. The calibrator can be configured to commence calibration of the current path that is not part of the first subset of current paths during the first frame and complete calibration of the current path that is not part of the first subset of current paths before the second frame. The gate driver motor controller interface and the microcontroller interface can be configured to communicate with signals having a SPI format. The SPI format can be an out of frame format and wherein the gate driver motor controller interface is configured to transmit the first subset of measured currents and request a second subset of the measured currents during a first frame, transmit the second subset of the measured currents and request a third subset of the measured currents during a second frame following the first frame, wherein the first, second, and third subsets of measured currents are different than each other and wherein the calibrator is configured to commence calibration of the current path that is not part of the first subset of current paths upon completion of the first frame. The gate driver motor controller can further include a diagnostic circuit including a processor configured to sum the current measured in each of the three current paths and a comparison circuit configured to compare summed currents to zero and generate a diagnostic signal indicative of whether a malfunction has occurred based on the comparison. The gate driver motor controller can further include a diagnostic circuit including a processor configured to compute the current in the current path that is not part of the first subset of current paths based on the first subset of measured currents, and a comparison circuit configured to compare the computed current with the current measured in the current path that is not part of the first subset of current paths and generate a diagnostic signal indicative of whether a malfunction has occurred based on the comparison. The gate driver motor controller can be provided as an integrated circuit.

Also described is a method for calibrating a gate driver motor controller configured to communicate with a microcontroller including measuring a current in each of three current paths, transmitting a first subset of the measured currents corresponding to a first subset of the current paths to the microcontroller during a first frame, transmitting a second subset of the measured currents corresponding to a second subset of the current paths different than the first set of current paths to the microcontroller during a second frame following the first frame, and commencing calibration of a current path that is not part of the first subset of current paths and that is part of the second subset of current paths during the first frame and completing calibration of the current path that is not part of the first subset of current paths and that is part of the second subset of current paths before the second frame.

Features may include one or more of the following individually or in combination with other features. Measuring the current in each of the three current paths can include coupling a sensing element in series with each of the three current paths and measuring a voltage across each of the sensing elements. The method can further include latching the current measurements in each of the three current paths. Transmitting the first subset of the measured currents and transmitting the second subset of the measured currents can include transmitting in a SPI format. The SPI format can be an out of frame format and the method can include transmitting the first subset of measured currents and requesting a second subset of the measured currents during a first frame, transmitting the second subset of the measured currents and requesting a third subset of the measured currents during a second frame following the first frame, wherein the first, second, and third subsets of measured currents are different than each other, and the method can further include commencing calibration of the current path that is not part of the first subset of current paths upon completion of the first frame. The method can further include summing the currents measured in each of the three current paths, comparing the summed currents to zero, and generating a diagnostic signal indicative of whether a malfunction has occurred based on the comparison. The method can further include computing the current in the current path that is not part of the first subset of current paths based on the first subset of measured currents, comparing the computed current with the current measured in the current path that is not part of the first subset of current paths, and generating a diagnostic signal indicative of whether a malfunction has occurred based on the comparison.

Also described is a gate driver motor controller a current measurement circuit configured to measure a current in each of three windings by measuring a voltage across three elements, each coupled in series with a respective one of the three windings, a communication interface configured to transmit to a microcontroller a first subset of the measured currents corresponding to a first subset of the windings, and a calibrator configured to calibrate a current through a winding that is not part of the first subset of windings when the first subset of the measured currents is transmitted.

Features may include one or more of the following individually or in combination with other features. The calibrator can be further configured to adjust a measured current by subtracting the calibration result. The communication interface can be configured to transmit the first subset of measured currents during a first frame, transmit a second subset of the measured currents during a second frame following the first frame, and transmit a third subset of the measured currents during a third frame following the second frame, wherein the first, second, and third subsets of measured currents are different than each other. The calibrator can be configured to commence calibration of the current path that is not part of the first subset of current paths during the first frame and complete calibration of the current path that is not part of the first subset of current paths before the second frame. The communication interface can be configured to communicate with signals having a SPI format as one non-limiting example. The SPI format can be an out of frame format and the communication interface can be configured to transmit the first subset of measured currents and request a second subset of the measured currents during a first frame, transmit the second subset of the measured currents and request a third subset of the measured currents during a second frame following the first frame, wherein the first, second, and third subsets of measured currents are different than each other and wherein the calibrator is configured to commence calibration of the current path that is not part of the first subset of current paths upon completion of the first frame.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
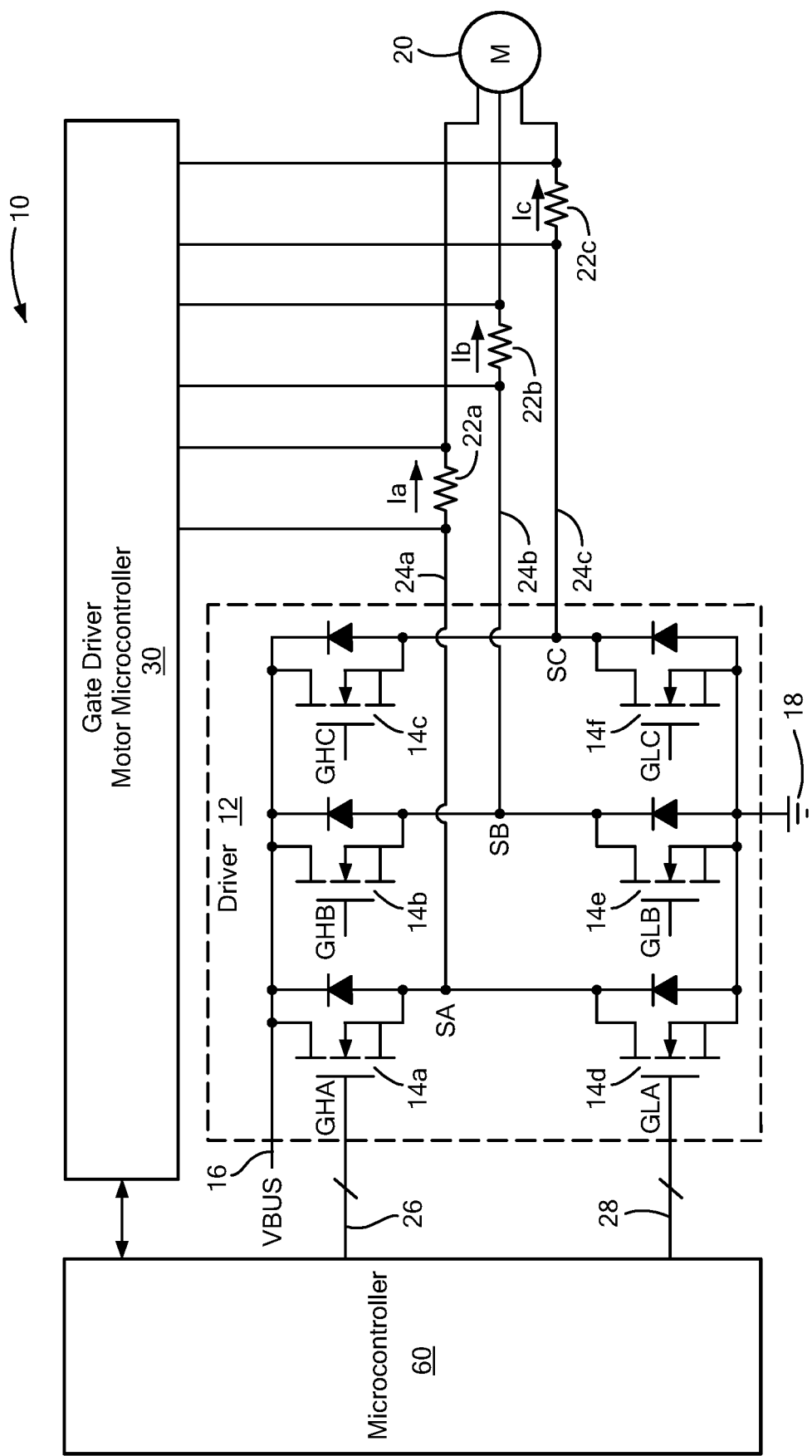
FIG. 1 is a simplified block diagram of a motor control system with a gate driver motor controller implementing current sense calibration according to the disclosure.

Referring to FIG. 1, a motor control system 10 for controlling operation of a motor 20 includes a gate driver motor controller 30, a microcontroller 60, and a driver 12 coupled to the motor. As will be explained, the gate driver motor controller 30 includes current measurement circuitry to measure current in the motor current paths 24a, 24b, 24c, an interface to transmit measured currents to the microcontroller 60, and a calibrator to calibrate a current path when measured current of that path is not being transmitted. The microcontroller 60 includes an interface to receive currents measured by the gate drive controller 30 and a processor to compute the current in a current path for which a measured current is not received.

Motor 20 can take various forms, such as a Brushless Direct Current (BLDC) motor, and can include more than one winding establishing more than one respective current path. For example, motor 20 can be a three-phase motor including three windings or phases A, B, and C, each establishing a respective current path 24a, 24b, 24c. It will be appreciated by those of ordinary skill in the art however that the current sense calibration circuitry and techniques described herein are not limited to any particular motor type or any particular number of motor windings.

Driver 12 includes switches 14a-14f coupled between a voltage source VBUS 16 and a reference or ground potential 18. Switches 14a-14f can be arranged in pairs, with each pair coupled together at a node SA, SB, SC that is further coupled to a respective motor winding, as shown. Each switch pair includes a high-side switch 14a, 14b, 14c controlled by a respective high-side control signal GHA, GHB, GHC (collectively control signals 26) and a low-side switch 14d, 14e, 14f controlled by a respective low-side control signal GLA, GLB, GLC (collectively control signals 28). The control signals GHA, GHB, GHC, GLA, GLB, GLC can be referred to collectively as commutation signals and are generated by microcontroller 60. In general, microcontroller 60 controls the switches 14a-14f based at least in part on measured phase currents and a user speed demand input signal such that, at any given time, current flows through one of the three windings.

Sensing elements 22a, 22b, 22c, each associated with a respective motor winding, can be coupled in series with a respective current path 24a, 24b, 24c, as shown. Illustrated sensing elements 22a-22c are in-phase shunt resistors. Current measurement circuitry of the gate driver motor controller 30 is configured to measure a voltage across respective resistors 22a-22c, which voltage is proportional to the current Ia, Ib, Ic through the resistors, respectively.

It will be appreciated by those of ordinary skill in the art that while the example sensing elements 22a-22c are in-phase shunt resistors, other elements and configurations are possible, such as low side (i.e., ground referenced) or high side current sensing configurations in which one or more magnetic field sensing elements or shunt elements can be coupled to one or more of the motor windings. In general, the sensing elements 22a-22c take a form and configuration that permits the current in each of the motor windings to be measured.

Figure 2:
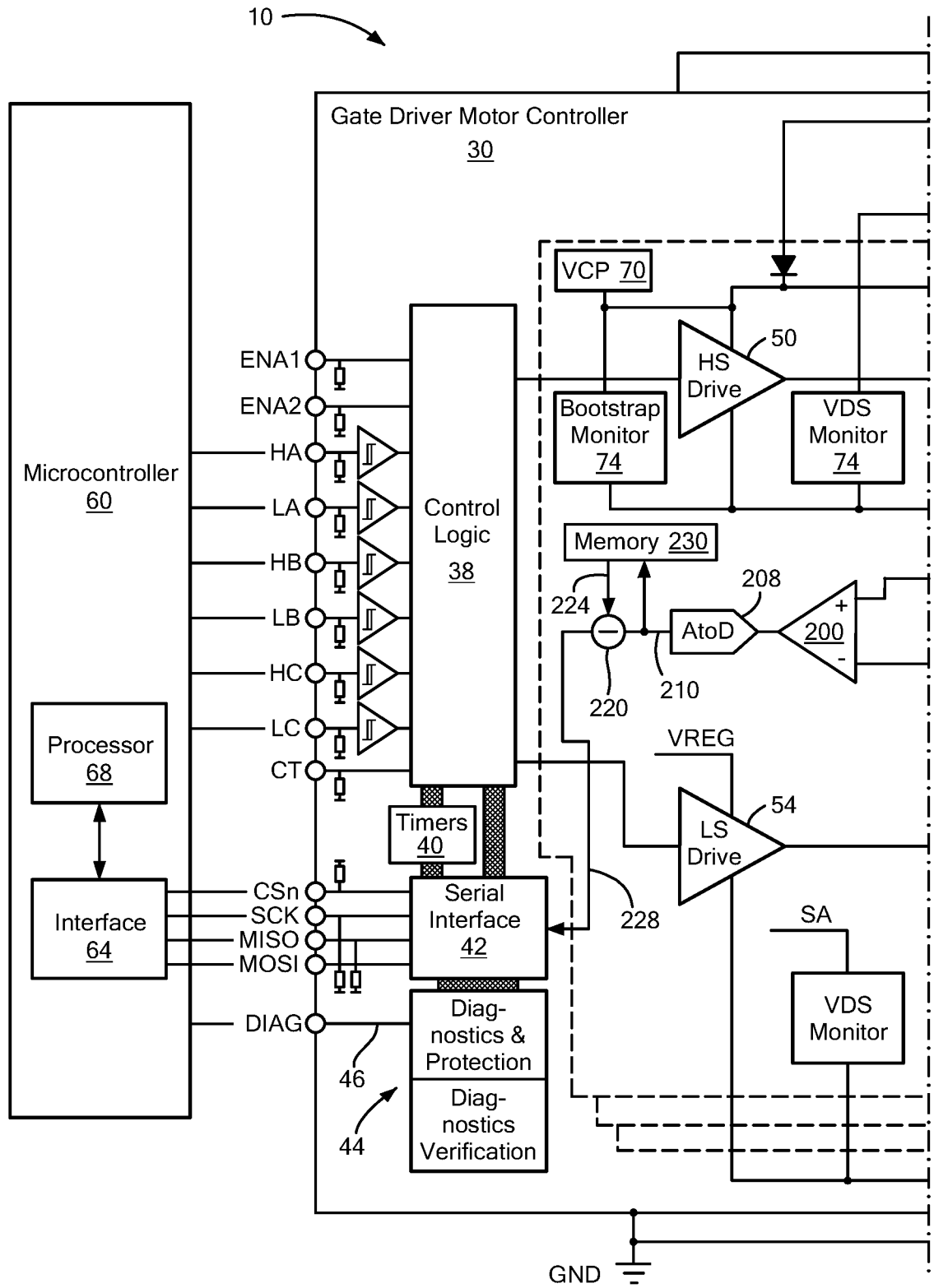
FIG. 2 is a further block diagram of the motor control system of FIG. 1 showing additional detail of the motor control system according to the disclosure.
Figure 2:
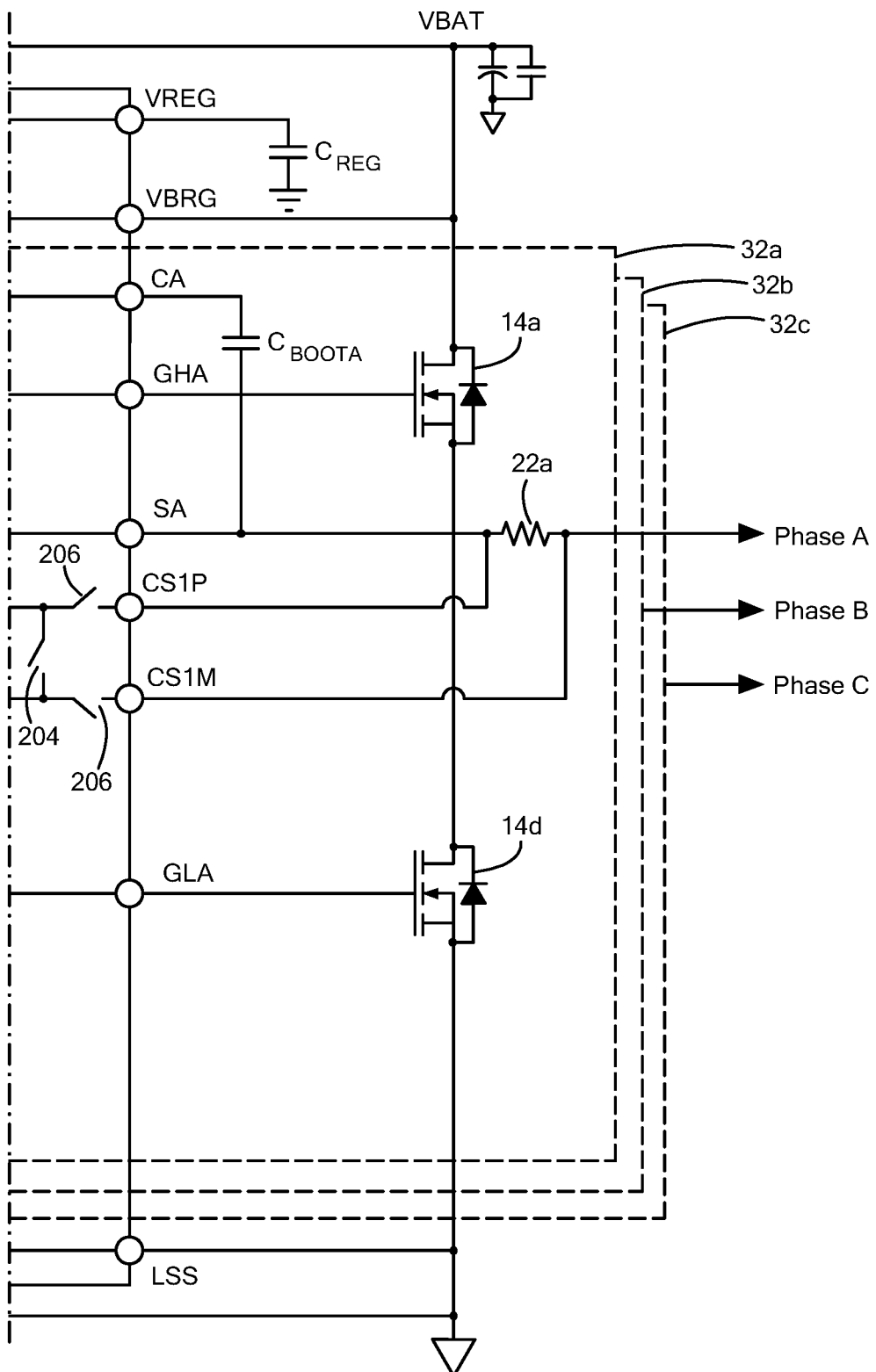

Referring also to FIG. 2, the motor control system 10 is shown in greater detail. For each motor phase A, B, C, the gate driver motor controller 30 includes common circuitry used in connection with processing current from, and control signals to, each of the motor phases and also includes dedicated circuitry for each of the motor phases. The common circuitry can include control logic 38, timers, 40, an interface 42, and diagnostic circuitry 44.

Circuitry dedicated to each of the motor phases is labeled as portions 32a, 32b, 32c, with portion 32a corresponding to the first motor phase A, portion 32b corresponding to the second motor phase B, and portion 32c corresponding to the third motor phase C. The circuitry dedicated to a respective motor winding will be described in connection with portion 32a associated with phase A; however, it will be appreciated that portion 32a can be the same as or substantially similar to circuitry portions 32b and 32c associated with motor phases B and C, respectively. Further, circuitry portions 32a, 32b, 32c and their respective current paths 24a, 24b, 24c can be referred to alternatively as channels.

Phase A circuitry portion 32a includes shunt resistor 22a and driver switches 14a, 14d, as shown. Control logic 38 can generate gate drive control signals based on commutation signals 26, 28 from the microcontroller 60 for coupling to a high side driver 50 and a low side driver 54, which drivers 50, 54 provide gate drive signals GHA, GLA to switches 14a, 14d, respectively. Additional features of controller 30 can include a voltage charge pump 70, a bootstrap voltage monitor 74, and a drain to source voltage monitor 78 arranged as shown.

Phase current measurement circuitry can be provided by a differential amplifier 200 having inputs coupled across shunt resistor 22a and also across a switch 204. In operation, when phase A current path 24a is being calibrated, switch 204 is closed; whereas, when phase A current path 24a is not being calibrated, switch 204 is open. With switch 204 open, the output of amplifier 200 is a voltage signal proportional to the current through the shunt resistor 22a. An analog-to-digital converter 208 converts the output of amplifier 200 into a corresponding digital measured current signal 210.

During calibration, current does not flow in the respective motor winding phase and switch 204 is closed, thereby shorting together the inputs of amplifier 200. This configuration should result in a zero-voltage output of amplifier 200. Any non-zero signal at the output of amplifier 200 can represent an offset, as may be at least in part attributable to drift over temperature, that could otherwise adversely impact the accuracy of the current measurement. Thus, such a non-zero signal can provide a calibration factor, or result on signal line 210 that can be used to adjust subsequent current measurements in order to compensate for such offset. It will be appreciated by those of ordinary skill in the art that while the illustrated calibration has the respective motor winding shorted by closed switch 204 for offset calibration, other arrangements are possible such as coupling the amplifier inputs to a reference voltage or current for example (not shown) in order to thereby adjust for sensitivity (gain) variations. It will also be appreciated by those of ordinary skill in the art that the shunt can be disconnected by operation of one or both switches 206.

Controller 30 includes a calibrator 220 configured to calibrate a phase current path. In the case of motor phase A, the calibrator can take the form of a subtraction element 220 that combines the calibration factor, or result (as may be represented by a non-zero signal on signal line 210 during calibration, which signal is stored in memory 230 for subsequent use) with a latched measured current signal 224. More particularly, the calibration result can be subtracted from a subsequent current measurement in order to thereby mitigate effects of signal path offset that could otherwise adversely impact the accuracy of current measurement.

Motor controller 30 can include a latch, as can take the form of a memory 230, such as an EEPROM or other type of non-volatile memory, coupled to signal line 210 to receive and latch phase currents measured by the current measurement circuit 200 and calibration results According to an aspect of the disclosure, interface 42 is configured to transmit a first subset of the measured currents Ia, Ib, Ic corresponding to a first subset of the current paths 24a, 24b, 24c and the controller 30 is configured to calibrate a current path that is not part of the first subset of current paths when the first subset of the measured currents is transmitted. More particularly, during a first communication time frame, controller 30 can transmit a first subset of the measured currents (e.g., Ia, Ib), during a second communication time frame, controller 30 can transmit a second subset of the measured currents (e.g., Ib, Ic), and during a third communication time frame, controller 30 can transmit a third subset of the measured currents (e.g., Ic, Ia), where the first, second, and third subsets of measured currents are different than each other. In this way, once two communication frames have occurred, the microcontroller 60 has received all three measured currents.

The microcontroller 60 includes an interface 64 configured to receive the first subset of measured currents and a processor 68 configured to compute the current in the current path that is not part of the first subset of current paths. Computation of the current is based on the first subset of measured currents. For example, microcontroller 60 can use Kirchhoff's current law to compute (i.e., reconstruct) a current Ic based on receiving measured currents Ia, Ib as follows: Ic=−Ia−Ib.

With this arrangement, current path calibration is performed without adversely impacting motor control timing since it is not necessary to delay current measurement transmission for calibration to be performed and without losing information because of the ability of the described calibration to externally reconstruct the current on all of the three phases for proper motor control without compromises in the current measurement. Furthermore, motor control accuracy is improved since the microcontroller 60 has all three of the currents Ia, Ib, Ic (two from the SPI communication and one computed) with the same time stamp (i.e., acquired at the same time).

Current measurement circuitry of the controller 30 can measure the current Ia, Ib, Ic in each of the three motor winding paths 24a, 24b, 24c. It will be appreciated by those of ordinary skill in the art that although it could suffice to measure only two of the three phase currents (since the third current can be reconstructed, or computed based on two measured currents), in safety critical applications it can be recommended or required to measure all three phase currents Ia, Ib, Ic for diagnostic purposes as described below in connection with diagnostic circuit 44. It will also be appreciated that two or three of the currents can be measured by respective circuitry 32a, 32b, 32c substantially simultaneously.

Interface 42 is configured to receive the latched measured currents Ia, Ib, Ic via signal line 228 (and like signal lines from phase B circuitry 32b and from phase C circuitry 32c) and transmit measured currents to the microcontroller 60 and can do so in various formats, or protocols. In the example embodiment, interface 42 communicates (and interface 64 receives) current information in a Serial Peripheral Interface (SPI) format. Alternatively however, other formats such as a Single Edge Nibble Transmission (SENT) format, a Local Interconnect Network (LIN) format, a CAN (Controller Area Network) format, an Inter-Integrated Circuit (I$^2$C) format, or other signal formats can be used.

As explained above, at any given time, two of the three measured currents Ia, Ib, Ic are transmitted by the interface 42 to the external microcontroller 60 and the current path associated with the third current is calibrated. Thus, in the example embodiment in which the interface 42 is a SPI interface, during any given SPI communication, the current information from two of the three phases is read.

Diagnostic circuit 44 is configured to verify accuracy of the measured currents Ia, Ib, Ic and provide a diagnostic signal 46 indicative of whether a malfunction has occurred. The diagnostic signal 46 can be provided to the microcontroller 60 to provide an indication of the operational status of the motor and gate driver motor controller 30. With this diagnostic information, it can be determined whether the measured currents transmitted to the microcontroller 60 can be trusted. For example, as long as a malfunction is not detected, the microcontroller 60 can confidently use two received measured currents to reconstruct the third current for use in commutating the motor 20.

In some embodiments, diagnostic circuit 44 can respond to all three measured currents Ia, Ib, Ic and can use Kirchhoff's current law to determine whether an error has occurred by determining whether or not the sum of the measured currents is zero. To this end, diagnostic circuit 44 can include a processor configured to sum the currents measured in each of the three current paths and a comparison circuit configured to compare the summed currents to zero and generate the diagnostic signal 46 indicative of whether a malfunction has occurred based on the comparison result. If the summation of the measured currents is zero, then the motor and current measurement circuitry are determined to be operating properly; whereas, if the summation of the measured currents is not zero, then a malfunction is determined to have occurred.

In some embodiments, diagnostic circuit 44 can perform diagnostics by using two measured currents (e.g., Ia, Ib) to reconstruct the third current (e.g., Ic) using Kirchhoff's current law and can compare the reconstructed current to a measurement of the third current. To this end, diagnostic circuit 44 can include a processor configured to compute the current in the current path that is not part of the first subset of current paths based on the first subset of measured currents and a comparison circuit configured to compare the computed current with the current measured in the current path that is not part of the first subset of current paths and generate a diagnostic signal indicative of whether a malfunction has occurred based on the comparison. If the measured and computed currents match, then the motor and current measurement circuitry are determined to be operating properly; whereas, if the measured and computed currents do not match, then a malfunction is determined to have occurred.

In some embodiments, gate driver motor controller 30 can be implemented in the form of an integrated circuit. However, it will be appreciated by those of ordinary skill in the art that the controller 30 and other components of the motor control system 10 can be implemented in various forms.

It will be appreciated by those of ordinary skill in the art that the illustrated delineation of the controller 30 and circuitry blocks and their functionality can be varied according to design considerations. Further, while electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

Figure 3:
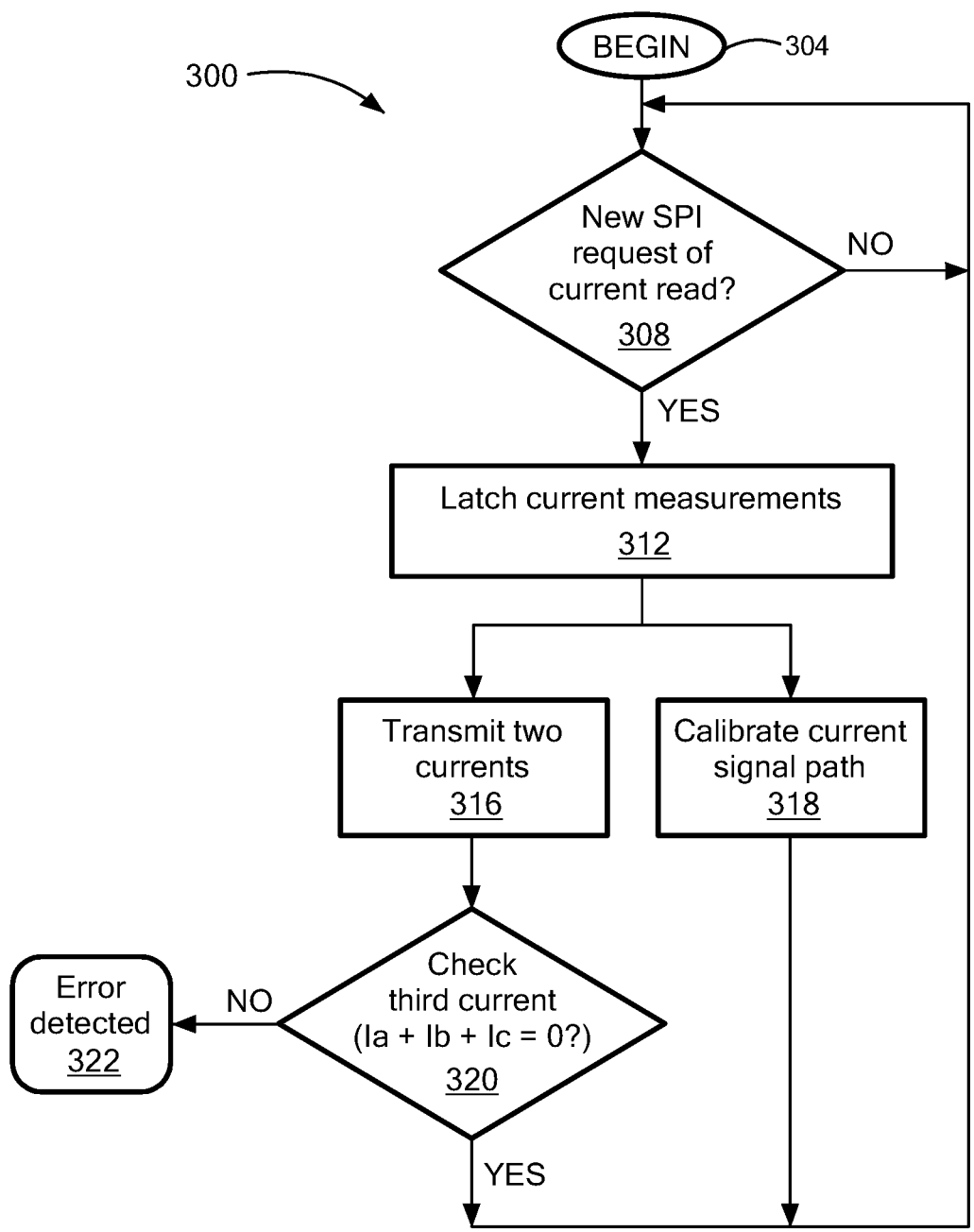
FIG. 3 is a flow diagram illustrating a method for current measurement, calibration, and diagnostics in the motor control system of FIGS. 1 and 2 according to the disclosure.

Referring also to FIG. 3, a method 300 for calibrating a gate driver motor controller, such as the gate driver motor controller 30 of FIGS. 1 and 2, commences at block 304. At block 308, it is determined whether a new SPI request of a current read has occurred. Although the method 300 is described in connection with communication between the gate driver motor controller 30 and a microcontroller (such as microcontroller 60 of FIGS. 1 and 2) taking the form of SPI communication, it will be appreciated by those of ordinary skill in the art that other communication formats and protocols are possible.

If a new SPI request of a current read has occurred, then at block 312, acquisition of two or three of the measured currents can be started and latched. For example, acquisition of two or three of the measured currents Ia, Ib, Ic can be started and latched. Alternatively, if a new SPI request of a current read has not occurred, then block 308 is repeated, as shown. As described above, currents Ia, Ib, Ic can be measured by respective differential amplifiers 200 of respective circuitry portions 32a, 32b, 32c having inputs coupled across a respective shunt resistor 22a, 22b, 22c, for example. Further, latching these measured currents can include storing the digital version of the current signal 228 in memory 230.

Having latched two or three of the measured currents Ia, Ib, Ic, at block 316, a first subset of the measured currents is transmitted. For example, in a scenario in which two measured currents Ia, Ib are latched in block 312, these two currents Ia, Ib can be transmitted to microcontroller 60 at block 316. In another scenario in which all three measured currents Ia, Ib, Ic are latched at block 312, any two or three currents can be transmitted to microcontroller 60 at block 316.

At block 318, one or more current signal paths is calibrated. For example, in the case where currents Ia, Ib are latched at block 312 and transmitted at block 316, at the same time the current is acquired and latched on Ia, Ib, the signal path of current Ic can be calibrated at block 318. As another example, in the case where all three currents Ia, Ib, Ic are latched at block 312, any one or all three signal paths can be calibrated at block 318. As described above, calibration can include shorting inputs of the respective current measuring amplifier 200 and measuring any non-zero signal that can represent a calibration factor to be applied to measured currents. It will be appreciated by those of ordinary skill in the art that blocks 316, 318 can be performed substantially simultaneously or can be performed sequentially or in an time overlapping fashion, as explained below in connection with the timing diagrams of FIGS. 4 and 5.

At block 320, diagnostics can be performed, such as by diagnostic circuitry 44, in order to thereby determine whether or not an error has occurred. For example, the third current (e.g., Ic) can be verified using Kirchhoff's current law to determine if Ia+Ib+Ic=0. If this relationship is not true, then, at block 322, an error is detected and can be communicated (e.g., to the microcontroller 60). As another example, at block 320, the third current can be verified by computing Ic as Ic=−Ia−Ib and comparing the result to the measured current Ic.

Process 300 can be repeated for each SPI communication. In a subsequent communication, a different subset of currents is transmitted at block 316 and a different signal path is calibrated at block 318. For example, in a first SPI communication, measured currents Ia and Ib can be transmitted and the path of current Ic can be calibrated, in a second SPI communication, measured currents Ib and Ic can be transmitted and the path of current Ia can be calibrated, and in a third SPI communication, measured currents Ic and Ia can be transmitted and the path of current Ib can be calibrated. In some embodiments, process 300 is repeated until all of the measured currents are transmitted and all of the current paths are calibrated. In the example embodiment of a three-phase system, this example has process 300 repeated three times. In some embodiments, process 300 can be continually repeated or can be repeated periodically as desired to meet system requirements.

Calibration at block 318 is completed before a next subset of currents is transmitted at the next iteration of process 300. In other words, in the case of currents Ia and Ib being transmitted at block 316 and the path of current Ic being calibrated at block 318, calibration of the path of current Ic should be completed before the next iteration of process 300 during which measured current Ic is transmitted.

Figure 4:
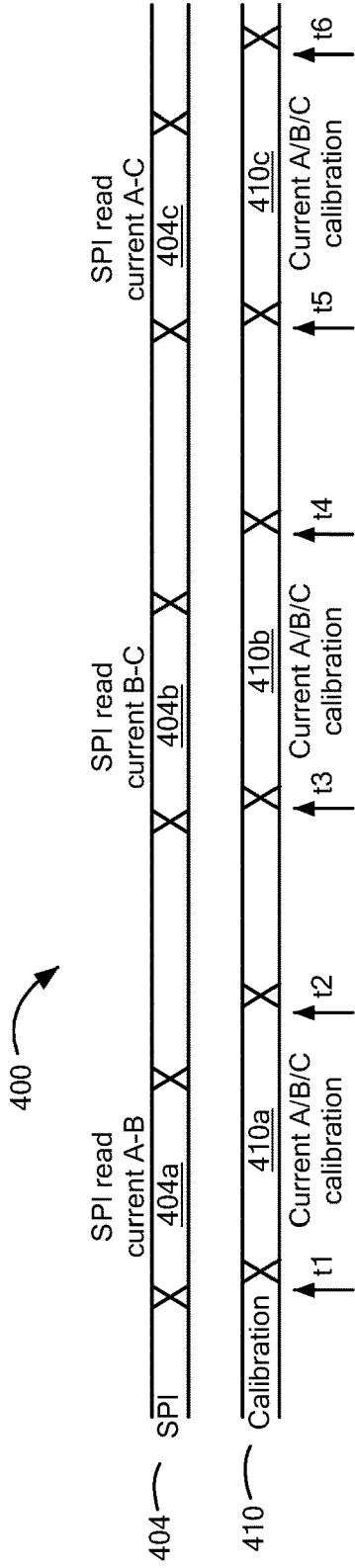
FIG. 4 is a timing diagram illustrating communication of measured currents and calibration according to the disclosure.

Referring to FIG. 4, a timing diagram 400 illustrates communication of measured currents and calibration timing according to the disclosure. Timing 404 can represent communications or frames 404a, 404b, 404c, such as SPI frames, transmitted by gate driver motor controller 30 to microcontroller 60. Timing 410 can illustrate calibration performed during time intervals 410a, 410b, 410c, as can occur at block 318 of FIG. 3 and as can be performed as described above.

During a first SPI frame 404a, a first subset of measured currents Ia, Ib can be transmitted, during a second SPI frame 404b, a second subset of measured currents Ib, Ic can be transmitted, and during a third SPI frame 404c, a third subset of measured currents Ic, Ia can be transmitted. Having received two measured currents, microcontroller 60 can compute the third current. Thus, once currents Ia and Ib are transmitted in SPI frame 404a, microcontroller 60 can compute current Ic based on received currents Ia and Ib. Similarly, once currents Ib and Ic are transmitted in SPI frame 404b, microcontroller 60 can compute current Ia based on received currents Ib and Ic. And once currents Ic and Ia are transmitted in SPI frame 404c, microcontroller 60 can compute current Ib based on received currents Ia and Ic.

As described above, calibration of a current path can be performed during a time interval when that particular current is not being transmitted. Thus, commencing at a time t1, a calibration time interval 410a can correspond to calibration of the path for current Ic since currents Ia and Ib are transmitted in SPI frame 404a. Similarly, commencing at a time t3, a calibration time interval 410b can correspond to calibration of the path for current Ia since currents Ib and Ic are transmitted in SPI frame 404b and commencing at a time t5, a calibration time interval 410c can correspond to calibration of the path for current Ib since currents Ia and Ic are transmitting in SPI frame 404c.

Calibration concludes before a next SPI frame so that the calibrated current path is ready for current measurement and measured current communication. Thus, before SPI frame 404b, calibration of the path for current Ic should conclude and similarly, before SPI frame 404c, calibration of the path for current Ib should be concluded as here occurs at a time t6. Here, such calibration of the current path Ic concludes at a time t2. It will be appreciated by those of ordinary skill in the art however that calibration of the current path Ic could take longer than being completed at time t2 as long as it is completed before the next SPI communication 404b when current Ic is read.

Figure 5:
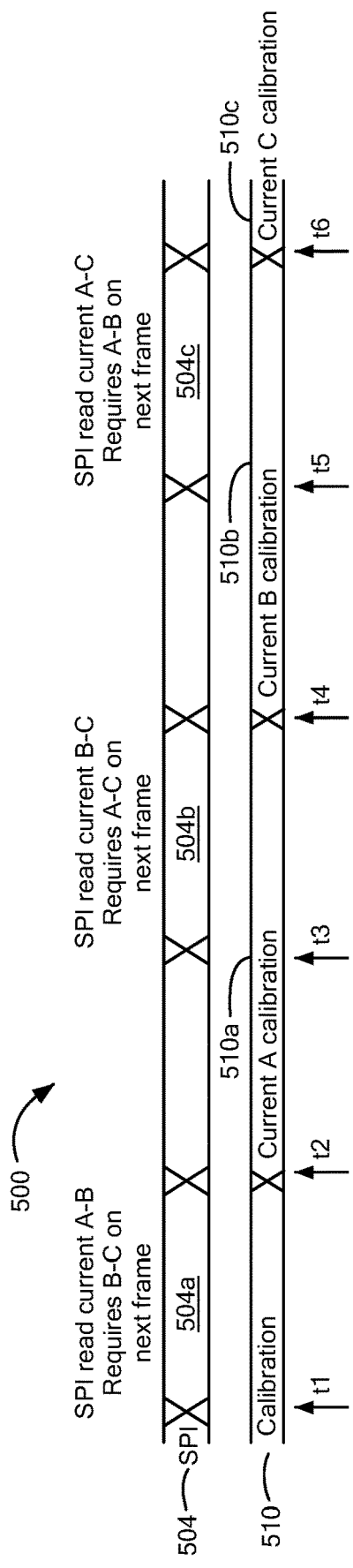
FIG. 5 is an alternative timing diagram illustrating out-of-frame communication of measured currents and calibration according to the disclosure.

Referring to FIG. 5, a timing diagram 500 illustrates out-of-frame communication of measured currents and calibration timing according to the disclosure. Timing 504 can represent communications or frames 504a, 504b, 504c, such as SPI frames, transmitted by gate driver motor controller 30 to microcontroller 60. Timing 510 can illustrate calibration performed during time intervals 510a, 510b, 510c, as can occur at block 318 of FIG. 3 and as can be performed as described above.

In the case of so-called "out-of-frame" communication, in each communication, the microcontroller 60 sends request for information to be communicated in the subsequent communication. With this method, it can be anticipated what current will be read so as to prepare for the calibration. For example, in SPI frame 504a, microcontroller 60 can communicate to the gate driver controller 30 that currents Ia and Ib are required on the next transmitted frame 504b. Thus, required information is known by the gate driver motor controller 30 in advance since the microcontroller 60 requests the information a frame in advance, thereby allowing calibration to be commenced in advance and in parallel on the phases that are not used. Thus, such advanced knowledge of information to be communicated in a next SPI frame can enable calibration to commence sooner than otherwise possible since, upon receipt of a particular request for information from the microcontroller 60, controller 30 can commence calibration on a channel for which the current is not to be communicated in the next SPI frame.

For example, at SPI frame 504a, currents Ia and Ib can be transmitted to the microcontroller 60 and the microcontroller can transmit an address of latched currents Ib and Ic to the controller 30, thereby indicating that in the next SPI frame 504b, currents Ib and Ic should be communicated. Similarly, at SPI frame 504b, in addition to reading currents Ib, Ic, microcontroller 60 can transmit to controller 30 addresses of latched currents Ia and Ic, thereby indicting that in the next SPI frame 504c, currents Ia and Ic should be communicated. And at SPI frame 504c, in addition to reading currents Ia, Ic, microcontroller 60 can transmit to controller 30 addresses of latched currents Ia and Ib, thereby indicating that in the next SPI frame (not shown), current Ia, Ib should be communicated.

Given advance knowledge in SPI frame 504a that currents Ib and Ic will be required in the next SPI frame 504b, gate driver controller 30 can commence calibration of phase A at a time t2 as illustrated by calibration time interval 510a since current Ia is not required in the next SPI frame 504b. Further, calibration of phase A need not be completed until the end of the next SPI frame 504b since it is known that current Ia need not be transmitted in this next frame 504b. Similarly, given advance knowledge in SPI frame 504b that currents Ia and Ic will be required in the next SPI frame 504c, gate driver controller 30 can commence calibration of phase B at a time t4 as illustrated by calibration time interval 510b since current Ib is not required in the next SPI frame 504c. Further, calibration of phase B need not be completed until the end of the next SPI frame 504c since it is known that current Ib need not be transmitted in this next frame 504c. And given advance knowledge in SPI frame 504c that currents Ia and Ib will be required in the next SPI frame (not shown), gate driver controller 30 can commence calibration of phase C at a time t6 as illustrated by calibration time interval 510c since current Ic is not required in the next SPI frame. Further, calibration of phase C need not be completed until the end of the next SPI frame since it is known that current Ic need not be transmitted in this next frame.

Consideration of the example permissible calibration timing 510 reveals that the calibration methodology illustrated in FIG. 5 can be advantageous in applications in which calibration requires more time to complete than would otherwise be available or in case two current measurements cannot be transmitted in the same frame. Although in this scenario, all three currents will not be available at the same time, the third current could be computed and diagnostics could still be performed based on Kirchhoff's current law.

It will be appreciated by those of ordinary skill in the art that while the example embodiments have the measured current from two phases being communicated in a single SPI communication and the path of the third phase being calibrated, the described circuitry and techniques can be applied in application in which other numbers of currents are communicated and other numbers of current paths are calibrated during a SPI frame. For example, during a SPI frame, current from a single-phase channel can be transmitted.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims. For example, while a three-phase motor is described, the described principles and techniques apply to an electric motor having more than or fewer than three phases.

It is felt therefore that these embodiments should not be limited to disclosed embodiments, but rather should be limited only by the spirit and scope of the appended claims.

What is claimed is:

1. A motor control system for controlling operation of a motor having three windings establishing three respective current paths, the motor control system comprising:
    a gate driver motor controller comprising:
        a current measurement circuit configured to measure a current in each of the three current paths;
        an interface configured to transmit a first subset of the measured currents corresponding to a first subset of the current paths; and
        a calibrator configured to calibrate a current path that is not part of the first subset of current paths when the first subset of the measured currents is transmitted; and
    a microcontroller configured to generate a commutation command signal for coupling to the gate driver motor controller, the microcontroller comprising:
        an interface configured to receive the first subset of measured currents; and
        a processor configured to compute the current in the current path that is not part of the first subset of current paths based on the first subset of measured currents.

2. The motor control system of claim 1, further comprising, for each of the three windings, a sensing element coupled in series with the respective winding.

3. The motor control system of claim 2, wherein the gate driver motor controller interface is configured to transmit the first subset of measured currents during a first frame, transmit a second subset of the measured currents during a second frame following the first frame, and transmit a third subset of the measured currents during a third frame following the second frame, wherein the first, second, and third subsets of measured currents are different than each other.

4. The motor control system of claim 3, wherein the calibrator is configured to commence calibration of the current path that is not part of the first subset of current paths during the first frame and complete calibration of the current path that is not part of the first subset of current paths before the second frame.

5. The motor control system of claim 1, wherein the gate driver motor controller further comprises a latch configured to latch the measured current in each of the three current paths.

6. The motor control system of claim 1, wherein the gate driver motor controller interface and the microcontroller interface are configured to communicate with signals having a SPI format.

7. The motor control system of claim 6, wherein the SPI format is an out of frame format and wherein the gate driver motor controller interface is configured to transmit the first subset of measured currents and request a second subset of the measured currents during a first frame, transmit the second subset of the measured currents and request a third subset of the measured currents during a second frame following the first frame, wherein the first, second, and third subsets of measured currents are different than each other and wherein the calibrator is configured to commence calibration of the current path that is not part of the first subset of current paths upon completion of the first frame.

8. The motor control system of claim 1, wherein the gate driver motor controller further comprises a diagnostic circuit comprising:
 a processor configured to sum the current measured in each of the three current paths; and
 a comparison circuit configured to compare summed currents to zero and generate a diagnostic signal indicative of whether a malfunction has occurred based on the comparison.

9. The motor control system of claim 1, wherein the motor controller further comprises a diagnostic circuit comprising:
 a processor configured to compute the current in the current path that is not part of the first subset of current paths based on the first subset of measured currents; and
 a comparison circuit configured to compare the computed current with the current measured in the current path that is not part of the first subset of current paths and generate a diagnostic signal indicative of whether a malfunction has occurred based on the comparison.

10. The motor control system of claim 1, wherein the gate driver motor controller is provided as an integrated circuit.

11. A method for calibrating a gate driver motor controller configured to communicate with a microcontroller, the method comprising:
 measuring a current in each of three current paths;
 transmitting a first subset of the measured currents corresponding to a first subset of the current paths to the microcontroller during a first frame;
 transmitting a second subset of the measured currents corresponding to a second subset of the current paths different than the first set of current paths to the microcontroller during a second frame following the first frame; and
 commencing calibration of a current path that is not part of the first subset of current paths and that is part of the second subset of current paths during the first frame and completing calibration of the current path that is not part of the first subset of current paths and that is part of the second subset of current paths before the second frame.

12. The method of claim 11, wherein measuring the current in each of the three current paths comprises coupling a sensing element in series with each of the three current paths and measuring a voltage across each of the sensing elements.

13. The method of claim 11, further comprising latching the current measurements in each of the three current paths.

14. The method of claim 11, wherein transmitting the first subset of the measured currents and transmitting the second subset of the measured currents comprise transmitting in a SPI format.

15. The method of claim 14, wherein the SPI format is an out of frame format and wherein the method comprises transmitting the first subset of measured currents and requesting a second subset of the measured currents during a first frame, transmitting the second subset of the measured currents and requesting a third subset of the measured currents during a second frame following the first frame, wherein the first, second, and third subsets of measured currents are different than each other, the method further comprising commencing calibration of the current path that is not part of the first subset of current paths upon completion of the first frame.

16. The method of claim 11, further comprising:
 summing the currents measured in each of the three current paths;
 comparing the summed currents to zero; and
 generating a diagnostic signal indicative of whether a malfunction has occurred based on the comparison.

17. The method of claim 11, further comprising:
 computing the current in the current path that is not part of the first subset of current paths based on the first subset of measured currents;
 comparing the computed current with the current measured in the current path that is not part of the first subset of current paths; and
 generating a diagnostic signal indicative of whether a malfunction has occurred based on the comparison.

18. A gate driver motor controller comprising:
 a current measurement circuit configured to measure a current in each of three windings by measuring a voltage across three elements, each coupled in series with a respective one of the three windings;
 a communication interface configured to transmit to a microcontroller a first subset of the measured currents corresponding to a first subset of the windings; and
 a calibrator configured to calibrate a current through a winding that is not part of the first subset of windings when the first subset of the measured currents is transmitted.

19. The motor controller of claim 18, wherein the calibrator is further configured to adjust a measured current by subtracting the calibration result.

20. The gate driver motor controller of claim 18, wherein the communication interface is configured to transmit the first subset of measured currents during a first frame, transmit a second subset of the measured currents during a second frame following the first frame, and transmit a third subset of the measured currents during a third frame following the second frame, wherein the first, second, and third subsets of measured currents are different than each other.

21. The gate driver motor controller of claim 20, wherein the calibrator is configured to commence calibration of the current path that is not part of the first subset of current paths during the first frame and complete calibration of the current path that is not part of the first subset of current paths before the second frame.

22. The gate driver motor controller of claim 18, wherein the communication interface is configured to communicate with signals having a SPI format.

23. The gate driver motor controller of claim 22, wherein the SPI format is an out of frame format and wherein the communication interface is configured to transmit the first subset of measured currents and request a second subset of the measured currents during a first frame, transmit the second subset of the measured currents and request a third subset of the measured currents during a second frame following the first frame, wherein the first, second, and third subsets of measured currents are different than each other and wherein the calibrator is configured to commence calibration of the current path that is not part of the first subset of current paths upon completion of the first frame.

* * * * *